Jan. 17, 1961 L. C. JOHNSON ET AL 2,968,769

FREQUENCY MODULATED OSCILLATOR SYSTEM

Filed Sept. 4, 1958

INVENTOR.
Lee C. Johnson
Eugene McVey

BY Gust & Irish

Attorneys 2,968,769

FREQUENCY MODULATED OSCILLATOR SYSTEM

Lee C. Johnson, Fort Wayne, and Eugene S. McVey, Lafayette, Ind., assignors to International Telephone and Telegraph Corporation Filed Sept. 4, 1958, Ser. No. 759,095

9 Claims. (Cl. 331—14)

This invention relates generally to frequency modulated oscillators and more particularly to an oscillator system adapted to be frequency modulated during definite intervals.

There are certain applications in the electronics art in which it is desirable to employ an oscillator which is frequency modulated during definite intervals and free running during the intervening intervals; such an oscillator system may normally provide a signal at its center frequency during the intervening intervals and be arranged to have its generated frequency shifted by, say, twenty-five (25) cycles about its center frequency during the definite intervals in order to provide a resultant coded output signal.

Frequency modulated oscillators are well known and are used in a variety of applications where limited frequency stability is not a problem. In a system of the type here under consideration, however, it is desirable that the center frequency be relatively stable. In the past, many things have been done in order to improve the center frequency stability of such systems, including such expedients as closely regulating all supply voltages, pre-aging components, temperature stabilization, etc.; these methods, however, resulted in potentially increased cost and overall size and created difficult production problems. In addition, even with all such practical controllable factors taken into account, the stability of prior circuits of this type known to the present applicants was not able to approach the stability of a crystal oscillator any more closely than one order of magnitude. It is therefore desirable to provide an oscillator system of the type adapted to be frequency modulated during definite intervals in which the center frequency is closely stabilized.

Our invention in its broader aspects, therefore, has solved the basic frequency stability problem encountered in prior oscillator systems of this type by synchronizing a conventional frequency modulated oscillator with a stable reference oscillator, such as a crystal oscillator, during the intervening intervals when the frequency modulated oscillator is not being frequency modulated. Since the frequency modulation intervals are relatively short, the center frequency thus remains substantially fixed during the intervals when the oscillator is being frequency modulated due to system time constants. Our improved system, therefore, overcomes the difficulties of prior systems of this type, providing an economical circuit which has the inherent frequency stability of the best obtainable frequency reference sources. In a more specific embodiment of our invention, we have provided a frequency modulated oscillator including means for varying the frequency thereof, such as a reactance tube. A reference oscillator, such as a crystal oscillator, is provided, and frequency discriminating means are provided for comparing the frequency outputs of the frequency modulated oscillator and the reference oscillator deriving a difference signal responsive thereto during the intervals intermediate the frequency modulated intervals, the output of the discriminating circuit being coupled to the reactance tube for controlling the frequency of the frequency modulated oscillator responsive to the reference oscillator. In order to disable this reference frequency control of the frequency modulated oscillator during the intervals when it is being frequency modulated, a gating circuit is provided coupled between the reference oscillator and the discriminating circuit for gating off the reference frequency responsive to the frequency modulating signal.

It is accordingly an object of our invention to provide an improved oscillator system adapted to be frequency modulated during definite intervals.

Another object of our invention is to provide an improved oscillator system of the type which may be frequency modulated during definite intervals and in which the center frequency is highly stable compared with prior systems known to the present applicants.

A still further object of our invention is to provide an improved oscillator system adapted to be frequency modulated during definite intervals in which a frequency modulated oscillator is synchronized with a highly stable reference oscillator during the intervals in which the frequency modulated oscillator is not being frequency modulated.

The above-mentioned and other features and objects of this invention and the manner of attaining them will become more apparent and the invention itself will be best understood by reference to the following description of an embodiment of the invention taken in conjunction with the accompanying drawings, wherein.

Figure 3:
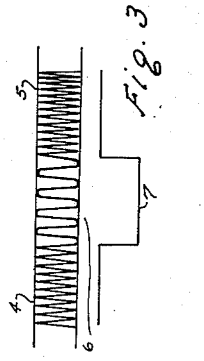
Fig. 3 schematically illustrates the output waveform of the circuit of Fig. 2.
Figure 1:
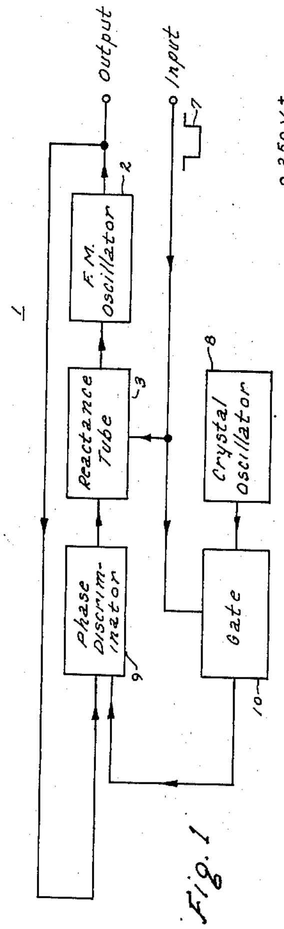
Fig. 1 is a block diagram illustrating the basic elements of our improved system.

Referring now briefly to Fig. 1, our improved frequency modulated oscillator system, generally identified as 1, includes a frequency modulated oscillator 2, which may incorporate any conventional circuitry, the oscillator 2 having its frequency varied in any conventional manner, as by means of a variable reactance tube 3 coupled in its tank circuit. Referring now additionally to Fig. 3, it is desired that the system 1 provide an output signal having a given frequency during spaced intervals 4 and 5 and that the output frequency be shifted, say, by twenty-five (25) cycles, during definite periods 6 responsive to a modulating signal 7. It is further desirable that the center frequency of the interval 6 be highly stabilized. In order to accomplish this result we provide a suitable oscillator 8 having a stable frequency output, such as a crystal oscillator. A portion of the output signal from the frequency modulated oscillator 2 and the output signal from the crystal oscillator 8 are coupled to a phase discriminator 9, the frequencies of the two signals being compared to provide an error signal. The phase discriminator 9 is coupled to the reactance tube 3 so that the error signal responsive to a phase difference between the output signal of the frequency modulated oscillator 2 and the crystal oscillator 8 varies the reactance of the reactance tube 3 thereby to control the frequency provided by the frequency modulated oscillator 2. In order to keep the error signal constant, and hence the center frequency, during the intervals 6 when the frequency modulated oscillator 2 is being frequency modulated, a gate circuit 10 is provided coupled between reference oscillator 8 and phase discriminator 9.

Figure 2:
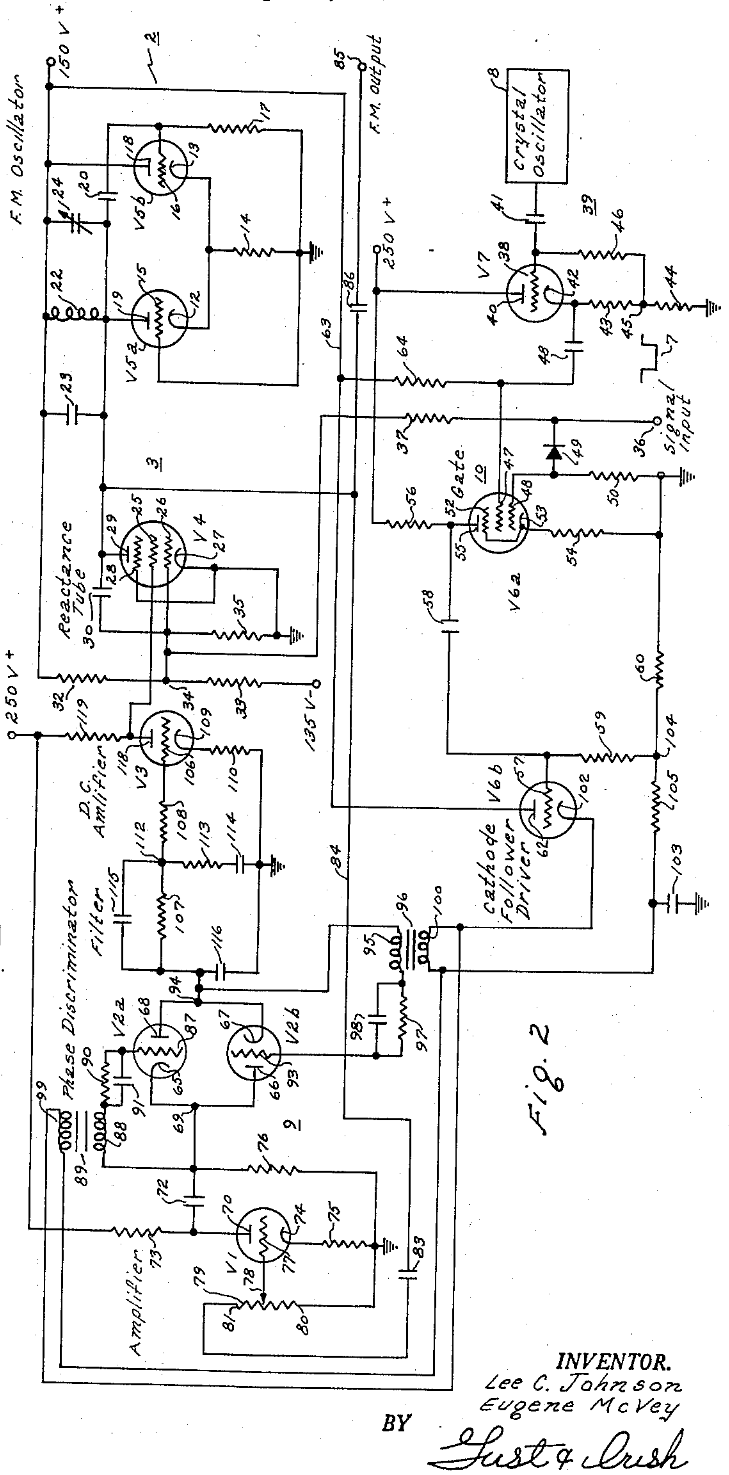
Fig. 2 is a schematic diagram illustrating an actual circuit incorporating our invention.

Referring now to Fig. 2, the frequency modulated oscillator 2 is shown as being of the free-running cathode coupled type incorporating two triode vacuum tubes V5*a* and V5*b*. The cathodes 12 and 13 of the tubes V5*a* and V5*b* are connected together as shown and to ground by a common cathode resistor 14. Grid 15 of tube V5*a* is directly connected to ground as shown, while grid 16 of tube V5*b* is connected to ground by means of grid resistor 17. The plate 18 of tube V5*b* is connected to a suitable source of positive plate potential, such as 150 volts, and the grid 16 of tube V5*b* is connected to the plate 19 of tube V5*a* by capacitor 20.

The tank circuit for frequency modulated oscillator 2 comprises inductance 22, fixed capacitance 23 and variable capacitor 24 and the effective capacitance of the reactance tube 3, shown here as being a pentode type tube V4. The effective capacitance of the reactance tube V4 is dependent upon the $g_m$ of the tube and its fixed circuit parameters. The $g_m$ of the reactance tube V4 is in turn a function of the voltage of its screen grid 25 and its control grid 26. In the specific circuit of Fig. 2, the control grid voltage is used to frequency modulate the center frequency of the oscillator 2 responsive to the modulating signals 7 and the screen grid 25 is used to control the center frequency to be equal to the reference frequency provided by crystal oscillator 8.

Here, it is seen that the cathode 27 of reactance tube V4 is directly connected to ground, the suppressor grid 28 is connected to the cathode, either internally or externally in accordance with conventional practice, and plate 29 is connected to control grid 26 by a suitable capacitor 30. A voltage divider comprising serially connected resistors 32 and 33 is connected between the +150 volt positive source of plate potential and a suitable source of negative potential, such as —135 volts with control grid 26 being connected to the midpoint therebetween, as at 34. Control grid 26 is also connected to ground by a suitable resistance 35. The modulating signal 7 from any suitable external source (not shown) is coupled to signal input terminal 36 and in turn coupled to control grid 26 of reactance tube V4 by means of a resistance 37 connected between signal input terminal 36 and point 34.

The voltage of screen grid 25 of reactance tube V4 is derived from phase-sensitive discriminator 9 which compares the frequency of the output of frequency modulated oscillator 2 and the frequency of the output from the reference crystal oscillator 8. The amplitude of the discriminator output is equal to $A \cos \theta$ when the two oscillators 2 and 8 are at the same frequency where A is the peak value of the reference oscillator and $\theta$ is the angle between the output voltage and the reference voltage. When the frequency modulated oscillator 2 tries to change its frequency away from the reference frequency provided by crystal oscillator 8 for any reason, the error signal provided from phase discriminator 9 increases in a direction to cause the frequency modulated oscillator 2 to return to the reference frequency by varying the effective capacitance of the reactance tube V4. When the two oscillators 2 and 8 are not in synchronism, the error voltage becomes a complex waveform whose fundamental is equal to the difference frequency; this waveform has a direct current component because the error signal is of the proper phase for "lock in" during one-half of the difference cycle which causes the difference frequency to decrease and the error signal is of a polarity to cause the frequency modulated oscillator 2 to move away from the reference frequency during the other half of the cycle and thus to speed up the difference frequency. However, since the time during which the frequency modulated oscillator 2 is trying to lock onto the reference oscillator frequency lasts longer than the time during which it is being forced away from the reference oscillator frequency, the average value of the error signal will be of a polarity to drive the frequency modulated oscillator 2 towards synchronization with the crystal oscillator 8. This error voltage will increase until the difference frequency becomes small enough for the frequency modulated oscillator 2 to lock in on the reference oscillator 8.

Since the closed loop operation of the circuit tends to keep the frequency modulated oscillator frequency equal to the reference frequency, the frequency modulated oscillator 2 could not be frequency modulated to provide the frequency shift in intervals 6 unless either the time constant of the loop were made very much greater than the duration of the intervals 6 or unless the loop is opened during the intervals 6 when the frequency modulated oscillator is being frequency modulated responsive to the modulating signals 7.

In the illustrated embodiment of Fig. 2, the frequency modulating signal 7 is used to trigger gate circuit 10 which thus opens up the loop and allows the frequency modulated oscillator 2 to have its frequency changed around its center frequency. When the modulating signal 7 is terminated, the frequency modulated oscillator 2 will return immediately to its center frequency because the phase discriminator circuit 9 includes a time constant circuit having a time constant longer than the duration of the modulating signal 7, hence the correct center frequency is maintained at all times.

Referring to the circuit of Fig. 2 in detail, the output circuit of crystal oscillator 8 (which may be any conventional frequency reference circuit and thus need not be here more fully described) is coupled to control grid 38 of triode tube V7 of cathode follower circuit 39. The plate 40 of tube V7 is directly coupled to a suitable source of positive plate potential, such as +250 volts, and its cathode 42 is connected to ground by a voltage divider consisting of series connected resistors 43 and 44. The mid-point 45 between series connected resistors 43 and 44 is connected to control grid 38 of tube V7 by means of suitable resistors 46.

The cathode 42 of tube V7 of cathode follower 39 is connected to screen grid 47 of tube V6*a* of the gate circuit 10 by coupling capacitor 48. The control grid 48 of tube V6*a* is connected to the modulating signal input terminal 36 by diode 49 and also to ground by resistor 50. The suppressor grid 52 of tube V6*a* is suitably connected, either internally or externally, to cathode 53 which in turn is connected to ground by means of resistor 54. The plate 55 of gate tube V6*a* is connected to the positive source of +250-volt plate potential by means of plate resistor 56. Thus, in the absence of a modulating signal 7, which it will be seen is in the form of a negative-going pulse, gate tube 10 functions as a conventional amplifier with its output signal taken from its plate resistor 56 being responsive to the reference frequency from crystal oscillator 8 impressed upon its screen grid 47 from cathode follower 39. It is obvious to those familiar with this art that other inputs are possible by using suitable gating circuitry.

The plate 55 of gate tube V6*a* is connected to grid 57 of cathode follower driver tube V6*b* by means of coupling capacitor 58. Control grid 57 is likewise connected to ground by suitable resistors 59 and 60, as shown, and plate 62 of tube V6*b* is connected to the positive source of +150 volt plate potential by means of connection 63. Screen grid 47 of gate tube V6*a* is also connected to the positive source of +150 volt plate potential by means of a suitable resistor 64.

The discriminator 9 consists of two triode tubes V2*a* and V2*b*, the cathode 65 of tube V2*a* being connected to the plate 66 of V2*b* and cathode 67 of tube V2*b* being connected to the plate 68 of tube V2*a*. Mid-point 69 between cathode 65 of tube V2*a* and plate 66 of tube V2*b* is connected to the plate 70 of amplifier tube V1 by coupling capacitor 72. Plate 70 of tube V1 is likewise connected to a source of positive plate potential, such as +250 volts, by a suitable plate resistor 73. The cathode 74 of amplifier tube V1 is connected to ground by cathode resistor 75 and mid-point 69 between cathode 65 of tube V2*a* and plate 66 of tube V2*b* is likewise conected to ground by means of resistor 76. The control grid 77 of amplifier tube V1 is connected to sliding element 78 of potentiometer 79 which has one end 80 connected to ground as shown and its other end 81 connected to the tank circuit of frequency modulated oscillator 2 by coupling capacitor 83 and connection 84. The tank circuit of frequency modulated oscillator 2 is likewise connected to the frequency modulated output terminal 85 by means of coupling capacitor 86 as shown.

The control grid 87 of phase discriminator tube V2*a* is connected to mid-point 69 between cathode 65 of tube V2*a* and plate 66 of tube V2*b* by means of secondary winding 88 of transformer 89 connected in series with resistor 90 having capacitor 91 connected thereacross. The control grid 93 of tube V2*b* is likewise connected to the mid-point 94 between cathode 69 of tube V2*b* and plate 68 of tube V2*a* by secondary winding 95 of transformer 96 connected in series with resistor 97 having capacitor 98 connected thereacross. The secondary windings 99 and 100 of transformers 89 and 96 are respectively connected in parallel with one end thereof being connected to cathode 102 of cathode follower driver tube V6*b* with the other end being connected to ground through capacitor 103 and to point 104 between resistors 59 and 60 by means of a suitable resistor 105.

Mid-point 94 between cathode 67 of phase discriminator tube V2*b* and plate 68 of tube V2*a* is connected to control grid 106 of direct current amplifier tube V3 by means of serially connected resistors 107 and 108. The cathode 109 of direct current amplifier tube V3 is connected to ground by cathode resistor 110 and the mid-point 112 between resistors 107 and 108 is connected to ground by serially connected resistor 113 and capacitor 114. A capacitor 115 is connected across resistor 107. It will be seen that the R–C network comprising resistors 107, 108 and 113 and capacitors 114 and 115 comprise an R–C filter. Another capacitor 116 is connected between mid-point 94 between cathode 67 of tube V2*b* and plate 68 of tube V2*a* and ground to form a time constant circuit for a purpose to be hereinafter more fully described. The plate 118 of direct current amplifier tube V3 is connected to the +250 volt source of positive plate potential by plate resistor 119 and is also connected to screen grid 25 of reactance tube V4.

It will now be seen that the cathode of one of the phase discriminator tubes V2*a*—V2*b* is connected to the plate of the other tube with the control grid of each phase discriminator tube being connected to its respective cathode through a grid leak bias network, i.e., 90 and 91 and 97 and 98, respectively, in series with secondary windings 88, 95 of transformers 89 and 96. Thus, it will be seen that the signal from the frequency modulated oscillator 2 is impressed on the control grids 87 and 93 of the phase discriminator tubes V2*a* and V2*b* from amplifier tube V1 while the signal from crystal oscillator 8 is likewise applied to the control grids 87 and 93 from cathode follower driver V6*b* by means of transformers 89 and 96. The arrangement of the phase discriminator tubes V2*a* and V2*b* allows the discriminator to conduct in either direction so that the output assumes a value which is equal to the amplitude of the input times the cosine of the angle between the input voltage and the grid A.C. voltage. In this connection, it is important that the grid-to-cathode voltage of tubes V2*a* and V2*b* be several times greater than the cut-off voltage value of the tubes being employed so that the circuit will conduct during only a small part of the cycle. The output capacitor 116 charges during the discriminator conducting period and retains the direct current voltage impressed thereon until the next cycle occurs. The grid voltage of phase discriminator tubes V2*a* and V2*b* goes slightly positive with respect to the cathode voltages each cycle in order to replace the current which has been discharged in the R–C network 90—91 and 97—98 between the control grids and cathodes of the tubes V2*a* and V2*b* during each cycle.

It will be observed it is also essential that the grid-to-cathode voltage applied to the two triodes V2*a* and V2*b* by transformers 89 and 96 be in phase. It will be seen that the output of the phase discriminator is applied to the direct current amplifier tube V3 by means of the R–C filter comprising resistance elements 107, 108 and 113 and capacitor elements 114 and 115 employed to stabilize the loop.

In an actual circuit in accordance with Fig. 2, the following component values were employed:

| | | |
|---|---|---|
| Tube V1 | | ½–12AU7 |
| Tubes V2*a* and V2*b* | | 12AX7 |
| Tube V3 | | ½–12AU7 |
| Tube V4 | | 6AU6 |
| Tubes V5*a* and V5*b* | | 5814 |
| Tube V6*a* | | ½–6U8 |
| Tube V6*b* | | ½–6U8 |
| Tube V7 | | ½–12AU7 |
| Resistor **14** | ohms | 1,000 |
| Resistor **17** | do | 100,000 |
| Capacitor **20** | mfd | .018 |
| Inductance **22** | mhs | 5.5 |
| Capacitor **23** | mmfds | 10,000 |
| Capacitor **24** | do | 7–45 |
| Capacitor **30** | do | 470 |
| Resistor **32** | ohms | 130,000 |
| Resistor **33** | do | 100,000 |
| Resistor **35** | do | 3,000 |
| Resistor **37** | do | 100,000 |
| Resistor **41** | mfd | .01 |
| Resistor **43** | ohms | 1,500 |
| Resistor **44** | do | 47,000 |
| Resistor **46** | do | 470,000 |
| Capacitor **48** | mfd | .01 |
| Diode **49** | | 1N38 |
| Resistor **50** | ohms | 47,000 |
| Resistor **54** | do | 100 |
| Resistor **56** | do | 10,000 |
| Capacitor **58** | mfd | .01 |
| Resistor **59** | ohms | 470,000 |
| Resistor **60** | do | 1,500 |
| Resistor **64** | do | 100,000 |
| Capacitor **72** | mfd | .1 |
| Resistor **73** | ohms | 47,000 |
| Resistor **75** | do | 1,500 |
| Resistor **76** | do | 100,000 |
| Resistor **79** | do | 100,000 |
| Capacitor **83** | mfd | .1 |
| Capacitor **86** | do | .01 |
| Resistor **90** | ohms | 100,000 |
| Capacitor **91** | mfd | .47 |
| Resistor **97** | ohms | 100,000 |
| Capacitor **98** | mfd | .47 |
| Capacitor **103** | do | .1 |
| Resistor **105** | ohms | 680 |
| Resistors **107, 108** and **113** | do | 100,000 |
| Resistor **110** | do | 1,500 |
| Capacitor **114** | mfd | 1.0 |
| Capacitor **115** | do | .01 |
| Capacitor **116** | ohms | 100,000 |
| Resistor **119** | do | 47,000 |

It will be readily apparent that the frequency compensating network 107–115 will require adjustment for the desired range in order to provide the requisite stability and that it may be desirable to increase the overall gain of the loop circuit in order to increase its operational range. It will also be readily apparent that two reactance tubes may be employed rather than the single reactance tube V4, one of such tubes being a reactance tube with a fixed screen voltage which would be employed for frequency modulating the center frequency of the frequency modulated oscillator 2 responsive to the input signal 7 and the other reactance tube being used to control the center frequency responsive to the difference signal from the phase discriminator. It will also be readily understood that modifications well within the skill of the man skilled in the art may be desirable in the phase discriminator 9 and direct current amplifier so that the direct current voltage stored on the output capacitor 116 of the phase discriminator 9 and the filter network will not vary during the gated-off period of operation due to the discriminator triode sections V2*a* and V2*b* not being completely cut-off and the grid current drawn by the direct current amplifier V3. It may thus be desirable to employ transformers 89 and 96 providing a large peak-to-peak amplitude of voltage on the control grids 86 and 93 of discriminator tubes V2*a* and V2*b* and it may be desirable further to select a tube for the direct current amplifier V3 having low grid current or a circuit which equivalently has extremely high input impedance. The filter circuit 107–115 should be of the low bandpass variety so that there is no attenuation to the direct current difference or error signal and should probably have an alternating current cut-off of say from five (5) to ten (10) cycles per second.

It will now be seen that we have provided a simple circuit for maintaining the center frequency of a frequency modulated oscillator, such center frequency being controlled by a stable reference oscillator during the periods in which it is not being frequency modulated.

While we have described above the principles of our invention in connection with specific apparatus, it is to be clearly understood that this description is made only by way of example and not as a limitation to the scope of our invention.

What is claimed is:

1. An oscillator system adapted to be frequency modulated during definite intervals comprising: frequency modulated oscillator means including means for varying the frequency thereof; a modulating signal input circuit coupled to said frequency varying means; reference oscillator means having a stable fixed frequency output; means for comparing the frequency outputs of said frequency modulated oscillator means and said reference oscillator means and for deriving a signal responsive thereto, said comparing means being coupled to said frequency varying means for controlling the frequency of said frequency modulated oscillator responsive to the frequency of said reference oscillator during the intervals intermediate said definite intervals; and means responsive to said modulating signal for disabling said comparing means whereby the frequency of said frequency modulated oscillator is controlled solely responsive to said modulating signal during said definite intervals.

2. An oscillator system adapted to be frequency modulated during definite intervals comprising: frequency modulated oscillator means including means for varying the frequency thereof; a modulating signal input circuit coupled to said frequency varying means; reference oscillator means having a stable fixed frequency output; means coupled to said reference oscillator means and to said frequency modulated oscillator means for comparing the frequency outputs thereof and for deriving a signal responsive thereto, said comparing means being coupled to said frequency varying means for controlling the frequency of said frequency modulated oscillator responsive to the frequency of said reference oscillator during the intervals intermediate said definite intervals; and gating means coupled between said comparing means and said reference oscillator means for decoupling the same responsive to a said modulating signal whereby the frequency of said frequency modulated oscillator is controlled solely responsive to said modulating signal during said definite intervals.

3. An oscillator system adapted to be frequency modulated during definite intervals comprising: frequency modulated oscillator means having a resonant circuit, said resonant circuit including variable reactance means whereby the frequency of said frequency modulated oscillator means is varied; a modulating signal input circuit coupled to said variable reactance means for varying the reactance of the same; reference oscillator means having a stable fixed frequency output; phase discriminator means coupled to said reference oscillator means and said frequency modulated oscillator means for comparing the frequency output thereof and for deriving a difference signal responsive thereto, said discriminator means being coupled to said variable reactance means for varying the reactance thereof responsive to said difference signal whereby the frequency of said frequency modulated oscillator is controlled responsive to the frequency of said reference oscillator during the intervals intermediate said definite intervals; and gating means for decoupling said discriminator means from one of said oscillator means responsive to a said modulating signal whereby the frequency of said frequency modulated oscillator is controlled solely responsive to said modulating signal during said definite intervals.

4. The system of claim 3 further characterized in that said phase discriminator means includes means having a time constant longer than said definite intervals whereby said difference signal is immediately available for varying the reactance of said variable reactance means upon termination of said modulating signal.

5. An oscillator system adapted to be frequency modulated during definite intervals comprising: a free running frequency modulated oscillator having a tank circuit, said tank circuit including a variable reactance tube having two control elements whereby the frequency of said frequency modulated oscillator is varied; a modulating signal input circuit coupled to one of said reactance tube control elements; a reference oscillator having a stable fixed frequency output and having an output circuit; a phase discriminator circuit having two input circuits and an output circuit, one of said phase discriminator input circuits being coupled to said frequency modulated oscillator tank circuit; and a gating circuit coupling said reference oscillator output circuit and the other of said phase discriminator input circuits whereby said phase discriminator circuit compares the frequency outputs of said frequency modulated oscillator and said reference oscillator and develops a signal responsive to the difference thereof in its output circuit, said gating circuit being coupled to said modulating signal input circuit whereby said phase discriminator circuit is decoupled from said reference oscillator responsive to said modulating signal during said definite intervals so that the frequency of said frequency modulated oscillator is controlled solely responsive to said modulating signal during said definite intervals; said phase discriminator having its output circuit coupled to the other of said reactance tube control elements whereby said difference signal varies the reactance of said reactance tube so that the center frequency of said frequency modulated oscillator is controlled responsive to the center frequency of said reference oscillator during the intervals intermediate said definite intervals.

6. The system of claim 5 in which said gating circuit includes a tube having two control elements respectively coupled to said reference oscillator and said modulating signal input circuit, said modulating signal cutting off said gating circuit valve.

7. The system of claim 5 further comprising a time constant circuit coupled between said phase discriminator output circuit and said other control element of said reactance tube, said time constant circuit having a time constant longer than said definite intervals.

8. The system of claim 5 further comprising an R–C filter circuit coupled between said phase discriminator output circuit and said other control element of said reactance valve; and a time constant circuit coupled to said discriminator output circuit, said time constant circuit having a time constant longer than said definite intervals.

9. The system of claim 5 in which said phase discriminator circuit comprises a pair of tubes each having at least cathode, control grid and plate elements with the cathode of each tube being connected to the plate of the other tube, each of said tubes having its cathode and control grid coupled together by one winding of a transformer, said frequency modulated oscillator tank circuit being coupled to an interconnected cathode and plate element of said tubes; said gating circuit being coupled to another winding on each of said transformers.

References Cited in the file of this patent

UNITED STATES PATENTS

| | | |
|---|---|---|
| 2,846,572 | Elliott | Aug. 5, 1958 |
| 2,866,161 | Davidoff | Dec. 23, 1958 |